United States Patent
Liao et al.

(10) Patent No.: US 8,519,390 B2
(45) Date of Patent: Aug. 27, 2013

(54) TEST PATTERN FOR MEASURING SEMICONDUCTOR ALLOYS USING X-RAY DIFFRACTION

(75) Inventors: Chin-I Liao, Tainan (TW); Teng-Chun Hsuan, Tainan (TW); I-Ming Lai, Kaohsiung (TW); Chin-Cheng Chien, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 31 days.

(21) Appl. No.: 13/189,565

(22) Filed: Jul. 25, 2011

(65) Prior Publication Data

US 2013/0026464 A1 Jan. 31, 2013

(51) Int. Cl.
*H01L 23/58* (2006.01)

(52) U.S. Cl.
USPC .......................................................... 257/48

(58) Field of Classification Search
USPC .......................................................... 257/48
See application file for complete search history.

(56) References Cited

U.S. PATENT DOCUMENTS

| | | | | |
|---|---|---|---|---|
| 6,657,276 | B1 * | 12/2003 | Karlsson et al. | 257/510 |
| 2004/0021076 | A1 * | 2/2004 | Kadyshevitch et al. | 250/310 |
| 2007/0267680 | A1 * | 11/2007 | Uchino et al. | 257/315 |
| 2008/0012073 | A1 * | 1/2008 | Frohberg et al. | 257/347 |

OTHER PUBLICATIONS

Kuhn et al., "Past, Present and Future: SiGe and CMOS Transistor Scaling", 2010.

* cited by examiner

*Primary Examiner* — Thao Le
*Assistant Examiner* — Laura Dykes
(74) *Attorney, Agent, or Firm* — Winston Hsu; Scott Margo

(57) ABSTRACT

A test pattern for measuring semiconductor alloys using X-ray diffraction (XRD) includes a first region to an Nth region defined on a wafer, and a plurality of test structures positioned in the first region and so forth up to in the Nth region. The test structures in the same region have sizes identical to each other and the test structures in different regions have sizes different from each other.

20 Claims, 5 Drawing Sheets

TEST PATTERN FOR MEASURING SEMICONDUCTOR ALLOYS USING X-RAY DIFFRACTION

BACKGROUND OF THE INVENTION

1. Field of the Invention

The present invention relates to a test pattern for measuring semiconductor alloys, and more particularly, to a test pattern for measuring semiconductor alloys using X-ray diffraction (hereinafter abbreviated as XRD) technique.

2. Description of the Prior Art

Semiconductor materials including IV groups, III-V groups, and II-VI groups are important materials used in wide ranges of devices of integrated circuits (ICs). For example, semiconductor alloys such as silicon germanium (SiGe) or silicon carbide (SiC) are grown on a conventional silicon substrate for serving as a recessed or raised source/drain and improving carrier mobility of device by providing stress to the channel region. In order to form a sufficient element for the device, parameters such as thickness, dopant concentration, and strain must be known well. Accordingly, it is always important to measure and monitor the quality of the semiconductor materials.

XRD is commonly used as a practical measuring technique in the research and development in semiconductor manufacturing. By measuring a sample structure formed on a wafer, common parameters such as abovementioned strain, dopant concentration, and thickness of the semiconductor alloy can be obtained by the XRD technique. Therefore, it is in need to improve x-ray signal strength so that the parameters and qualities of the semiconductor alloys are faithfully conveyed.

SUMMARY OF THE INVENTION

According to an aspect of the present invention, a test pattern for measuring semiconductor alloys using XRD is provided. The test pattern a first region to an Nth region defined on a wafer, and a plurality of test structures positioned in the first region and so forth up to in the Nth region. The test structures in the same region have sizes identical to each other and the test structures in different regions have sizes different from each other.

According to another aspect of the present invention, a test pattern for measuring source/drain semiconductor layers using XRD is provided. The test pattern includes a first region to an Nth region electrically isolated from each other in a wafer, a plurality of source/drain structures positioned in the first region and so forth up to in the Nth region, and a plurality of gates respectively positioned in between the source/drain structures in the first region and so forth up to in the Nth region.

According to the test patterns for measuring the semiconductor alloys, particularly the semiconductor alloys forming the source/drain layers, using XRD provided by the present invention, the test structures in different regions have sizes different from each other. The test structures formed in different regions are provided to improve the X-ray signal strength, therefore the device characteristics can be measured easily. Furthermore, the test structures having different sizes are provided to stimulate devices having different sizes in the wafer. Accordingly, the XRD is able to faithfully convey the parameters and qualities of the semiconductor alloys in the wafer and the process for forming the devices.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a test pattern for measuring semiconductor alloys using XRD provided by a preferred embodiment of the present invention, wherein FIG. 2 illustrates the test pattern obtained after the FIG. 1 step;

FIG. 3 illustrates a portion of the test pattern obtained after the FIG. 2 step;

FIG. 4 illustrates the test pattern obtained after the FIG. 3 step; and

FIG. 5 is a schematic drawing illustrating a portion A of FIG. 4

DETAILED DESCRIPTION

Please refer to FIGS. 1-5, which are schematic drawings illustrating a test pattern for measuring semiconductor alloys using XRD provided by a preferred embodiment of the present invention. It will be understood that, although the terms, first, second, third, etc. may be used herein to describe various elements, components, regions, layers and/or sections, these elements, components, regions, layers and/or sections should not be limited by these terms. Theses terms are only used to distinguish one element, component, region, layer or section from another element, component, region, layer or section. Thus, a first element, component, region, layer or section discussed below could termed a second element, component, region, layer or section without departing from the teachings of the present invention.

Figure 1:
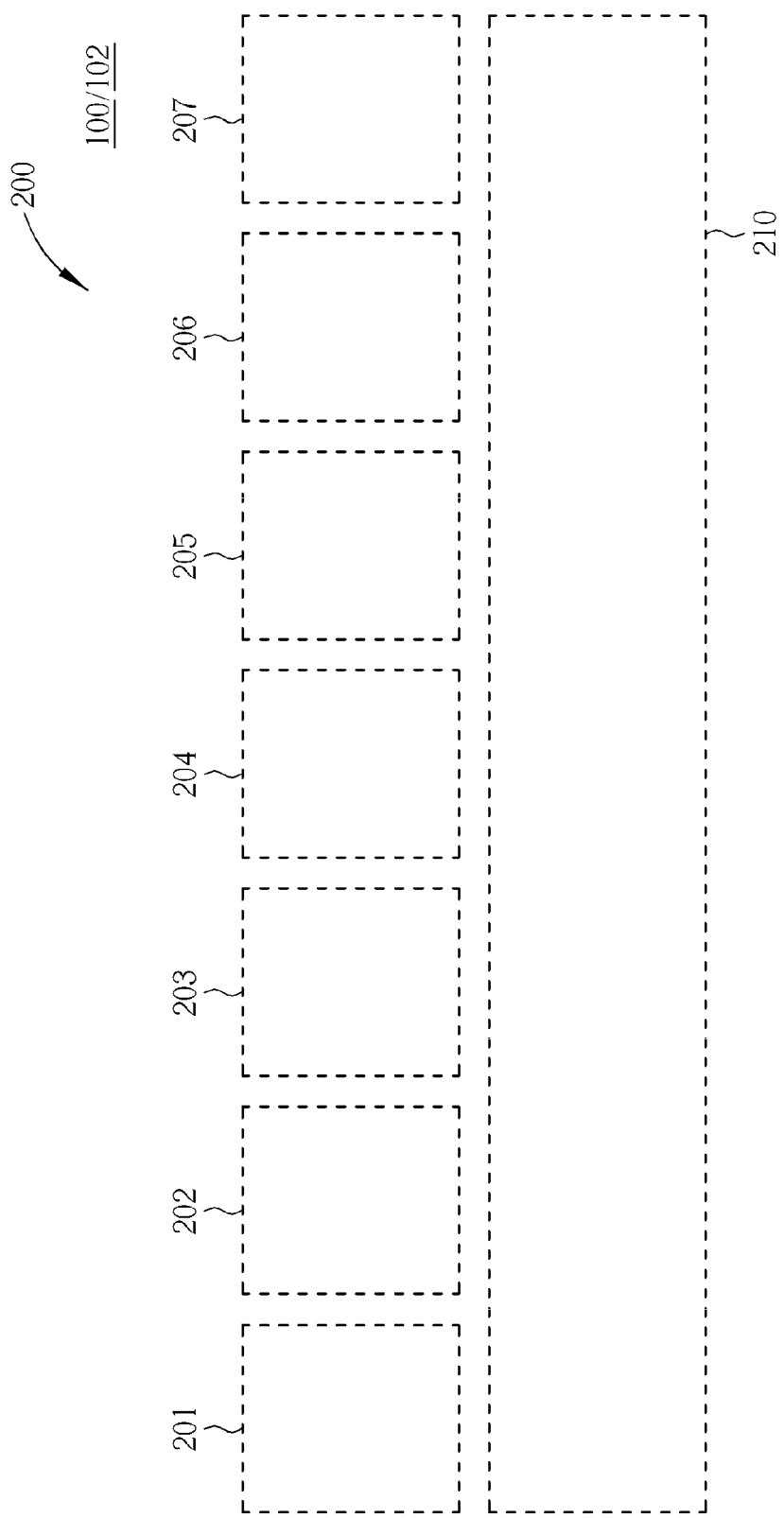

According to the preferred embodiment, a test pattern 200 is provided for measuring the semiconductor alloys, such as epitaxial layers in the source/drain, using XRD. As shown in FIG. 1, the test pattern 200 for XRD includes a first region to an Nth region defined on a wafer 100, preferably in a scribe line 102 of the wafer. It is noteworthy that N is a natural number larger than 2 and, exemplarily in the preferred embodiment but limited to, equal to 7. Accordingly, the test pattern 200 provided by the preferred embodiment includes a first region 201 to a seventh region 207, and the sizes of the first region 201 to the seventh region 207 are all the same. Furthermore, an assist region 210 can be selectively defined beyond the first region to the Nth region that are the first region 201 to the seventh region 207 in the preferred embodiment. It is noteworthy that a sum of areas of the first region 201 to the seventh region 207 is smaller than equal to the area of the assist region 210.

Figure 2:
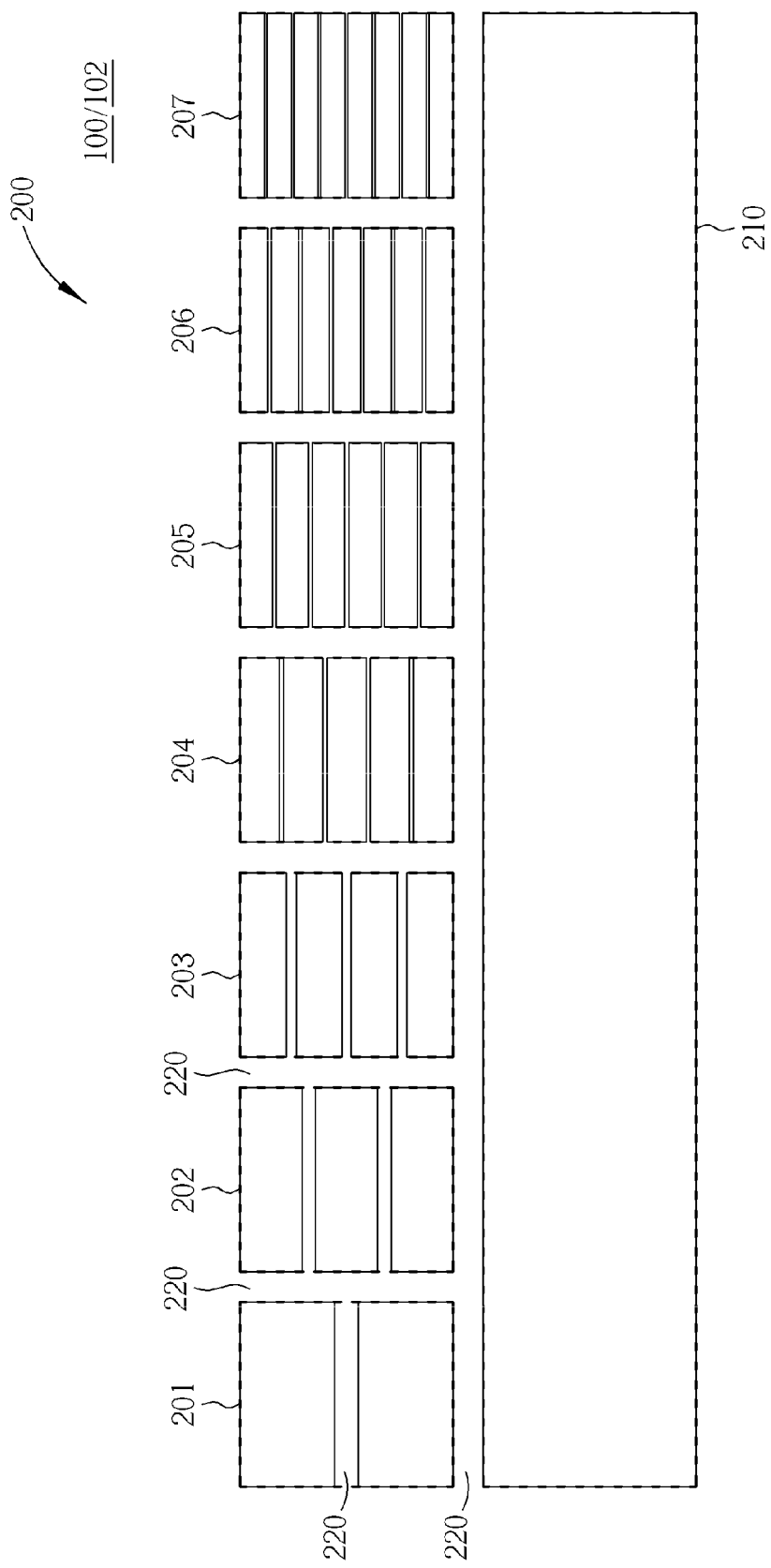

Please refer to FIG. 2. The test pattern 200 provided by the preferred embodiment further includes a plurality of first insulating layers 220, and the first insulating layers 220 include shallow trench isolations (hereinafter abbreviated as STIs). The STIs 220 can be formed by conventional STI process; therefore those details are omitted in the interest of brevity. More important, the STI process used to form the first insulating layers 220 is the STI process used to form the STIs for providing electrical isolations between devices or active regions in the dices of the wafer 100. As shown in FIG. 2, the first region 201 to the seventh region 207 and the assist region 210 are all electrically isolated from each other by the first insulating layers 220. It is noteworthy that the first insulating layers 220 are also formed within the first region 201 and so forth up to in the seventh region 207. More important, a width of the first insulating layers 220 is gradually reduced from the first region 201 to the seventh region 207. Briefly speaking, a width of the first insulating layer 220 in the N−1th region is larger than a width of the first insulating layer 220 in the Nth region.

Figure 3:
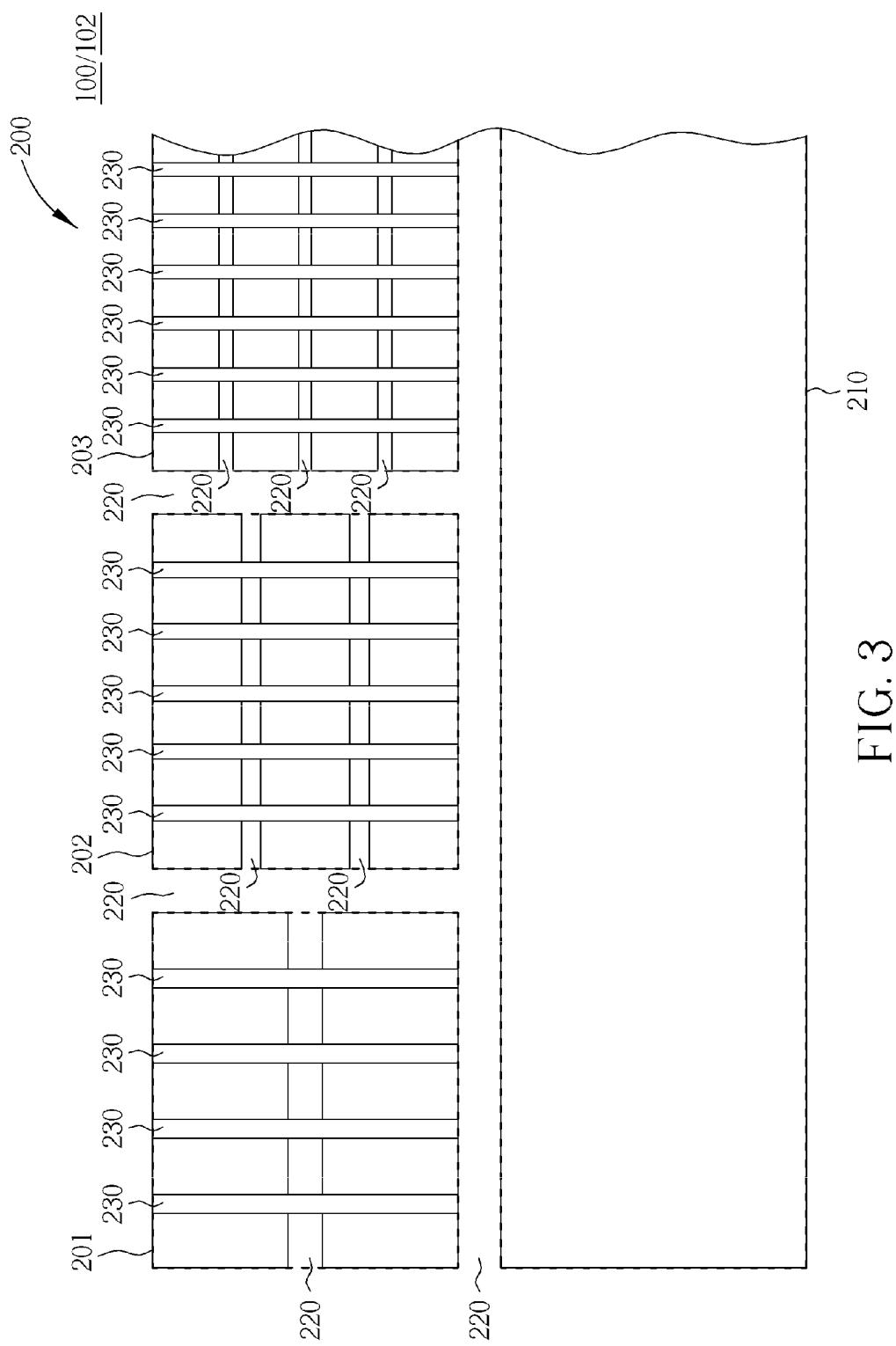

Please refer to FIG. 3. Please note that FIG. 3 illustrates only a portion of the test pattern 200 obtained after the FIG. 2 step in order to clarify the features of the preferred embodiment. Though only the first region 201 to the third region 203 and a portion of the assist region 210 are shown in FIG. 3, those skilled in the art should understand that the fourth region 204 to the seventh region 207 and the other portion of the assist region 210 should not be ignored. As mentioned above, since the test pattern 200 is provided for measuring the epitaxial layers in the source/drain, logic processes are performed to form elements such as polysilicon gates (not shown) and lightly-doped drains (LDDs) (not shown) in the active regions (not shown) of the wafer 100. Since those details are well-known to those skilled in the art, the details are omitted for simplicity. After forming the LDDs in the active regions, an insulating layer (not shown) such as a silicon nitride layer or silicon oxide layer is formed on the wafer 100 and followed by performing a patterning process to form a disposable spacer (not shown) on the gates in the active regions and a plurality of second insulating layers 230 in the first region 201 and so forth up to in the seventh region 207. It is noteworthy that a width of the second insulating layers 230 is gradually reduced from the first region 201 to the seventh region 207. Briefly speaking, a width of the second insulating layer 230 in the N−1th region is larger than a width of the second insulating layer 230 in the Nth region. As shown in FIG. 3, in the first region 201 to the seventh region 207, the second insulating layers 230 are perpendicular to the first insulating layers 220, thus the first insulating layers 220 and the second insulating layers 230 form an insulating grid in the first region 201 and so forth up to in the seventh region 207. In the preferred embodiment the polysilicon gates (not shown) are formed only in the active region but not in the first region 201 to the seven region 207. And thus the second insulating layer 230 is formed directly on the wafer 100 and contacts the wafer 100 (as shown in FIG. 5).

Additionally, in a modification to the preferred embodiment, the polysilicon gate defined by a silicon nitride had mask layer can be formed in the first region 201 and so forth up to in the seventh region 207 with the second insulating layer 230 formed on its sidewalls. In accordance with the modification, the second insulating layer 230 formed on the sidewalls of the polysilicon gates and the silicon nitride formed on top of the polysilicon gates work together to form the insulating grid with the first insulating layer 220.

Figure 4:
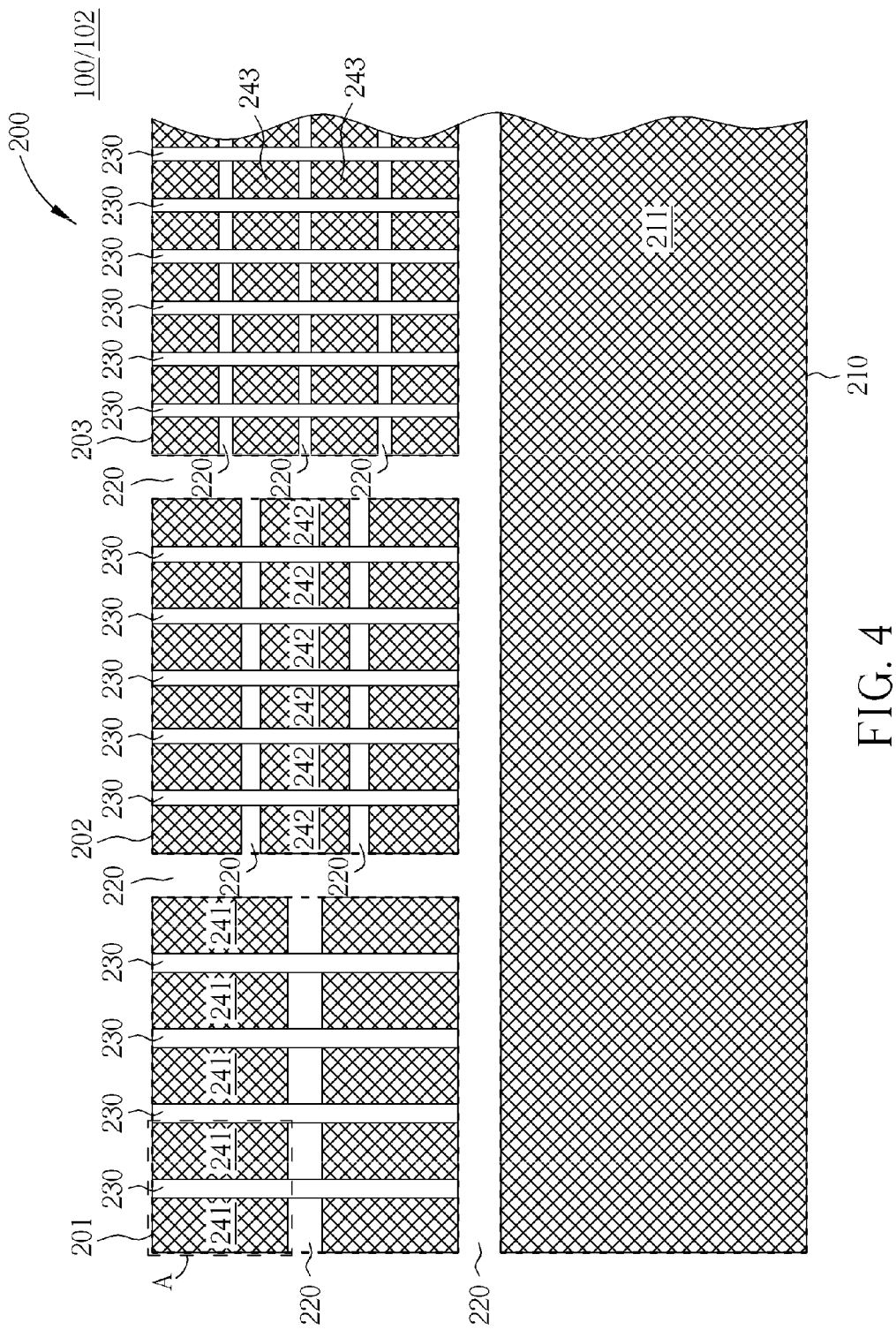
Figure 5:
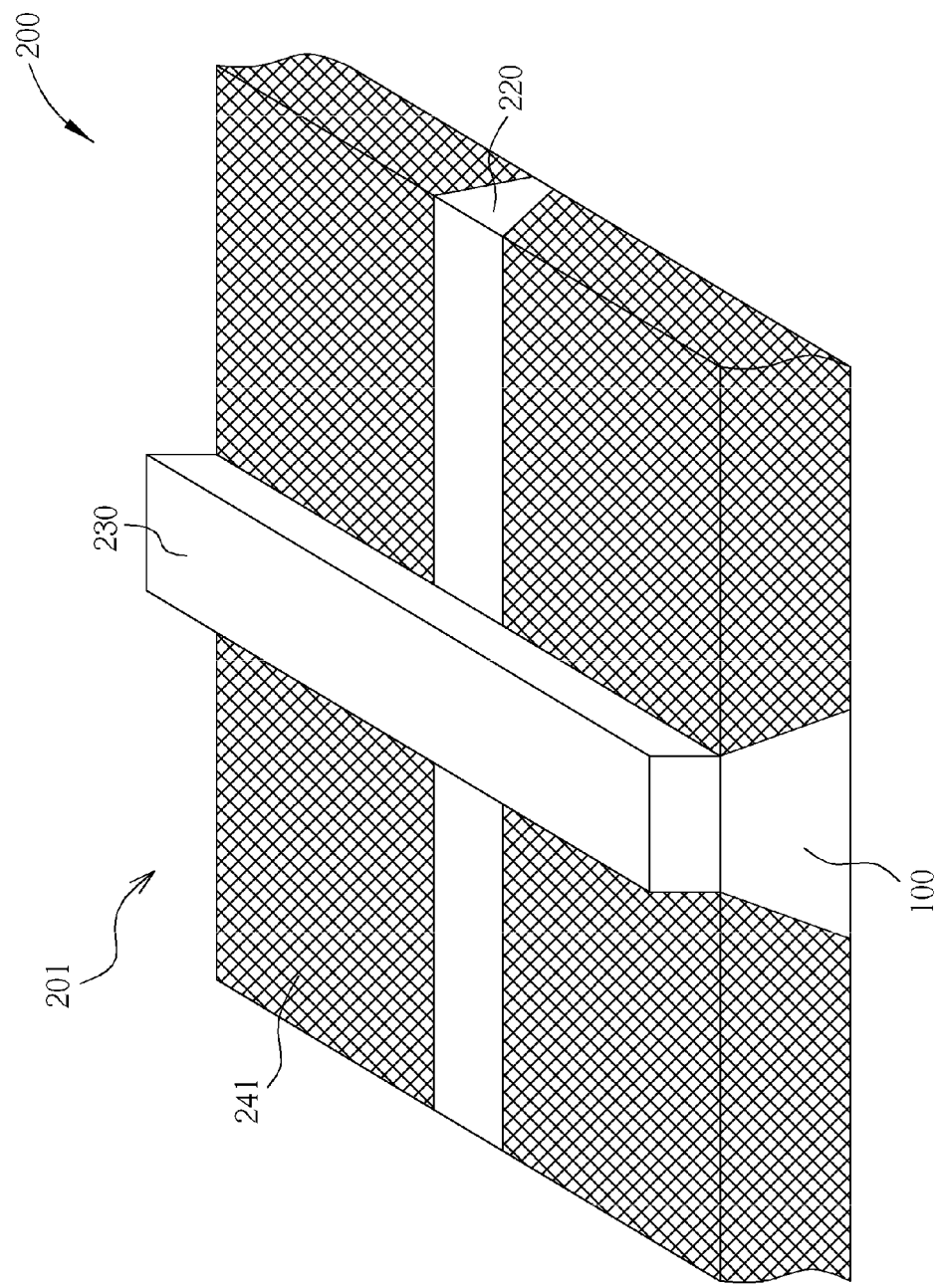

Please refer to FIG. 4 and FIG. 5, wherein FIG. 5 is a schematic drawing illustrating a portion A of FIG. 4. After forming the insulating grids consisting of the first insulating layers 220 and the second insulating layers 230, an etching process is performed to form recesses (not shown) at two sides of the gates in the active regions with the disposable spacer and the gates serving as the etching mask. Those recesses are formed for the following selective epitaxial growth (SEG) process. Simultaneously, a plurality of recesses (not shown) is formed in the first region 201 and so forth up to in the seventh region 207 with the insulating grids serving as the etching mask. Next, the SEG process is performed to form epitaxial layers in each recess. As shown in FIG. 4 and FIG. 5, since the epitaxial layers grow along a surface of the silicon substrate, the epitaxial layers are formed only in the recesses defined by the insulating grids. In the preferred embodiment, the epitaxial layers include semiconductor alloys such as silicon germanium (SiGe) or silicon carbide (SiC), but not limited to this. The epitaxial layers serve as test structures according to the preferred embodiment; therefore each test structure includes the same semiconductor alloys. Accordingly, a plurality of first test structures 241 is positioned in the first region 201, a plurality of second test structures 242 is positioned in the second region 202, a plurality of third test structures 243 is positioned in the third region 203, and so forth up to in the seventh region 207. The first test structures 241 in the first region 201 are isolated from each other by the insulating grids consisting of the first insulating layers 220 and the second insulating layers 230. In the same concept, the second test structures 242 in the second region 202 are isolated from each other and the third test structures 243 in the third region 203 are isolated from each other, and so on to the seventh test structures 247 in the seventh region 207. As shown in FIG. 4, the first test structures 241 in the first region 201 are arranged in an array, the second test structures 242 in the second region 202 are arranged in an array, and the third test structures 243 in the third region 203 are arranged in an array, and so on to the seventh test structures 247 in the seventh region 207, but not limited to this. More important, the first test structures 241 in the first region 201 are larger than the second test structures 242 in the second region 202, and so on to the seventh test structures 247 in the seventh region 207. Briefly speaking, the N−1th test structures are larger than the Nth test structures. In addition, an assist test structure 211 can be formed in the assist region 201 as shown in FIG. 4.

The first test structures 241 to the seventh test structures 247 are provided to simulate the source/drain layers in the active regions, therefore the first test structures 241 to the seventh test structures 247 are also taken as the first source/drain structures 241 to the seventh source/drain structures 247. More important, the first test structures 241 in the first region 201 are separated by the second insulating layers 230, which serve as the dummy gate separating the first source/drain structures 241. In the same concept, the second source/drain structures 242 are separated by the dummy gate 230 in the second region 202, and the third source/drain structures 243 are separated by the dummy gate 230 in the third region 203, and so on to the seventh source/drain structures 247 in the seventh region 207. Accordingly, each dummy gate 230 and the source/drain structures formed at its two opposite sides simulate a device in the active regions.

Please still refer to FIG. 4. Accordingly, the preferred embodiment provides a plurality of test structures 241-247 with different sizes to simulate the source/drain of the different sizes in the active region. Therefore, the characteristics of the semiconductor alloys in devices of different sizes can be easily and one-time observed. In addition, the assist test structure 211 serves as a comparison for the devices of different sizes in the XRD measurement. More important, by increasing the amounts of the test structures 241-247 of such great amount, the x-ray signal strength is substantially improved. Thus, the film characteristics such as thickness, dopant concentration, and even the strain can be faithfully conveyed by performing the XRD. Additionally, though the preferred embodiment provides the source/drain structures 241-247 serving as the test structures, it should not be limited that the test pattern provided by the present invention can be used for measuring other semiconductor alloys using XRD.

Please note that the test pattern 200 having the test structures 241-247 with different sizes is formed in a scribe line of the wafer 200 in accordance with the preferred embodiment, thus the test pattern is about to simulate the devices formed in the active regions in the wafer 100 for in-line metrology no matter what the sizes of devices are. In a modification to the preferred embodiment, the test pattern 200 having the test structure 241-247 with different sizes can be formed in a monitor wafer in order to control the quality of integrated circuits.

According to the test patterns for measuring the semiconductor alloys, particularly the semiconductor alloys forming the source/drain layers, using XRD provided by the present invention, the test structures in different regions have sizes different from each other. The test structures formed in different regions are provided to improve the X-ray signal strength, therefore the device characteristics can be measured easily. Furthermore, the test structures having different sizes are provided to stimulate devices having different sizes in the wafer. Accordingly, the XRD is able to faithfully convey the parameters and qualities of the semiconductor alloys in the wafer and the process for forming the devices.

Those skilled in the art will readily observe that numerous modifications and alterations of the device and method may be made while retaining the teachings of the invention.

What is claimed is:

1. A test pattern for measuring semiconductor alloys using X-ray diffraction (XRD), comprising:
    a first region to an Nth region defined on a wafer; and
    a plurality of test structures positioned in the first region and so forth up to in the Nth region; the test structures in the same region having sizes identical to each other and the test structures in different regions having sizes different from each other, wherein the test structures are epitaxial layers only equal to an epitaxial layer of a source/drain formed in the wafer.

2. The test pattern for measuring semiconductor alloys according to claim 1, wherein the test pattern is formed in a scribe line of the wafer.

3. The test pattern for measuring semiconductor alloys according to claim 1, wherein the N is a natural number larger than 2.

4. The test pattern for measuring semiconductor alloys according to claim 3, wherein a size of the test structures in the Nth region is smaller than a size of the test structures in the N−1th region.

5. The test pattern for measuring semiconductor alloys according to claim 1, wherein the test structures in the same region are isolated from each other and the test structures in different regions are electrically isolated from each other.

6. The test pattern for measuring semiconductor alloys according to claim 5, wherein the test structures in the same region are isolated by an insulating grid.

7. The test pattern for measuring semiconductor alloys according to claim 6, wherein the insulating grid comprises a plurality of first insulating layers and a plurality of second insulating layers, and the first insulating layers and the second insulating layers are perpendicular to each other respectively in the first region and so forth up to in the Nth region.

8. The test pattern for measuring semiconductor alloys according to claim 7, wherein a width of the first insulating layers in different regions are different from each other, and a width of the second insulating layer in different regions are different from each other.

9. The test pattern for measuring semiconductor alloys according to claim 7, wherein the first insulating layer comprises shallow trench isolation (STI) and the second insulating layer comprises silicon oxide or silicon nitride.

10. The test pattern for measuring semiconductor alloys according to claim 1, wherein the test structures in the same region are arranged in an array.

11. The test pattern for measuring semiconductor alloys according to claim 1, wherein the test structures comprise silicon germanium or silicon carbide.

12. The test pattern for measuring semiconductor alloys according to claim 1, further comprising an assist test structure formed in an assist region.

13. A test pattern for measuring source/drain semiconductor layers using X-ray diffraction (XRD), comprising:
    a first region to an Nth region electrically isolated from each other in a wafer;
    a plurality of test structures positioned in the first region and so forth up to in the Nth region, wherein the test structures are only equal to a source/drain formed in the wafer; and
    a plurality of gates respectively positioned in between the test structures in the first region and so forth up to in the Nth region.

14. The test pattern for measuring source/drain semiconductor layers according to claim 13, wherein the N is a natural number larger than 2.

15. The test pattern for measuring source/drain semiconductor layers according to claim 14, wherein the test structures in the Nth region are smaller than the test structures in the N−1th region.

16. The test pattern for measuring source/drain semiconductor layers according to claim 13, wherein the test structures serving as the source/drain in the same region are isolated from each other by the gates and a plurality of STIs.

17. The test pattern for measuring source/drain semiconductor layers according to claim 16, wherein the gates and the STIs in the same region are perpendicular to each other.

18. The test pattern for measuring source/drain semiconductor layers according to claim 16, wherein a width of the gates in the N−1th region is larger than a width of the gates in the Nth region, and a width of the STIs in the N−1th region is larger than a width of the STIs in the Nth region.

19. The test pattern for measuring source/drain semiconductor layers according to claim 13, wherein the gates comprise insulating materials.

20. The test pattern for measuring source/drain semiconductor layers according to claim 13, wherein the test structure comprises silicon germanium or silicon carbide.

* * * * *